(12) United States Patent
Takao et al.

(10) Patent No.: US 6,479,140 B1
(45) Date of Patent: Nov. 12, 2002

(54) RADIO WAVE ABSORBING MATERIALS, RADIO WAVE ABSORBER, AND RADIO WAVE ANECHOIC CHAMBER AND THE LIKE MADE BY USING THE SAME

(75) Inventors: Toshinori Takao; Masayoshi Suzue, both of Tokushima; Kohei Takanishi; Masayuki Inoue, both of Yonago; Kazuhiko Mori, Higashikurume, all of (JP)

(73) Assignee: Otsuka Chemical Co., Ltd., Osaka (JP)

( * ) Notice: Subject to any disclaimer, the term of this patent is extended or adjusted under 35 U.S.C. 154(b) by 0 days.

(21) Appl. No.: 09/554,276

(22) PCT Filed: Apr. 20, 1998

(86) PCT No.: PCT/JP98/01813

§ 371 (c)(1),
(2), (4) Date: May 12, 2000

(87) PCT Pub. No.: WO99/25166

PCT Pub. Date: May 20, 1999

(30) Foreign Application Priority Data

Nov. 12, 1997 (JP) .............................................. 9-310832

(51) Int. Cl.[7] ................................................. B32B 5/22
(52) U.S. Cl. .............................. 428/317.9; 428/308.4; 428/319.1
(58) Field of Search ........................... 428/308.4, 317.9, 428/319.1

(56) References Cited

U.S. PATENT DOCUMENTS 3,876,571 A * 4/1975 Cobbledick et al. ..... 260/2.5 AJ
4,301,040 A * 11/1981 Berbeco ....................... 252/511
4,944,998 A * 7/1990 Ko et al. ...................... 428/327

FOREIGN PATENT DOCUMENTS

| JP | 60-101999 | 6/1985 |
|---|---|---|
| JP | 63-80598 | 4/1988 |
| JP | 1-223242 | 9/1989 |
| JP | 4-91111 | 3/1992 |
| JP | 5-183293 | 7/1993 |
| JP | 5-243781 | 9/1993 |
| JP | 6-314894 | 11/1994 |
| JP | 8-67544 | 3/1996 |
| JP | 8-337701 | 12/1996 |
| JP | 9-55190 | 2/1997 |
| JP | 9-267421 | 10/1997 |
| JP | 9-283971 | 10/1997 |

OTHER PUBLICATIONS

Translation of JP–9 51190, Kanda et al, Feb. 18, 1997.*
Abstract translation of JP–402178335A, Hiratsuka et al, Jul. 11, 1990.*
Abstract translation of JP–356129241A, Hasegawa et al, Oct. 9, 1981.*

* cited by examiner

Primary Examiner—Blaine Copenheaver
Assistant Examiner—Hai Vo
(74) Attorney, Agent, or Firm—Smith, Gambrell & Russell, LLP

(57) ABSTRACT

The present invention provides a wave absorber holding both nonflammability and flexibility and having advantageous properties regarding the lightness in weight, the thermal insulation, the sound insulation, the sound isolation, and the workability to ensure a certain freedom in shaping. Each of wave absorbing materials A1, A2, and A3 given as embodiments of the present invention include a conductive filler, an inorganic endothermic filler, and an organic binder as main constituents. A wave absorber A30 for wave anechoic rooms and semi-wave anechoic rooms is prepared by using any of these wave absorbing materials A1, A2, and A3.

17 Claims, 5 Drawing Sheets

F I G. 1
F I G. 2
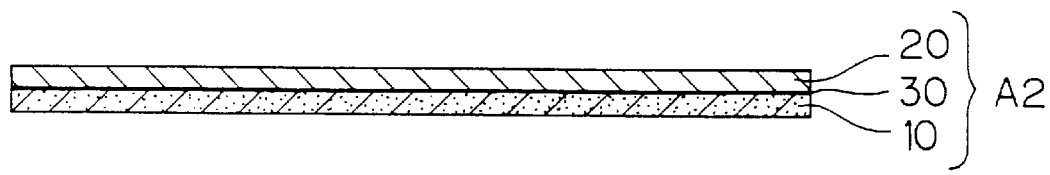

RADIO WAVE ABSORBING MATERIALS, RADIO WAVE ABSORBER, AND RADIO WAVE ANECHOIC CHAMBER AND THE LIKE MADE BY USING THE SAME

TECHNICAL FIELD

The present invention relates to a nonflammable wave absorbing material, a method of manufacturing the same, and a nonflammable construction material having wave absorbing properties and, more particularly, to a wave absorbing material that holds non-flammability or semi-nonflammability and flexibility to cancel the brittleness and has advantageous properties regarding the lightness in weight, the thermal insulation, the sound insulation, the sound isolation, and the workability.

BACKGROUND ART

Wave anechoic rooms and semi-wave anechoic rooms have been used to simulate the electromagnetic wave radiation and the wave reflection properties. A variety of wave absorbers have been proposed for such a wave anechoic room. Most of such wave absorbers are composed of inorganic materials (e.g. Unexamined Patent Publication (Kokai) No. 5-243781) and thereby have a problem of brittleness, while holding sufficient hardness for the purpose of shape-keeping. A pointed part of a pyramidal shape is formed inside the wave anechoic rooms. The brittleness of the material causes the pointed part to be easily broken when being in contact with another object. The inorganic material also makes the wave absorbers undesirably heavy and expensive and does not attain the sufficient nonflammability.

One recently proposed wave absorbing material disclosed in Unexamined Patent Publication (Kokai) No. 8-67544 includes cement, light-weight aggregate, non-conductive fibers, and a synthetic resin emulsion as main constituents and may further have organic microballoons, carbon graphite, or carbon fibers as additional constituents according to the requirements. This prior art technique reduces the weight of the wave absorbing material by using the light-weight aggregate, the synthetic resin emulsion, and the organic microballoons. According to the disclosure of the Publication, however, the possible weight reduction level expressed by the specific gravity is hardly expected to be not less than 0.3. This prior art technique uses cement as the matrix material. It generally requires half a year to a year for exertion of the final strength of cement. The resulting wave absorbing material may accordingly have cracks, due to the volumetric shrinkage in the course of hardening the cement. Namely the prior art technique does not provide the wave absorbing material of the stable properties.

It is required to provide molds suitable for the respective desired shapes. This results in the high manufacturing cost of the wave absorber.

In order to solve the problems arising in the prior art wave absorbers, as results of intensive studies, the present invention provides a wave absorbing material holding both non-flammability and flexibility and having advantageous properties regarding the lightness in weight, the thermal insulation, the sound insulation, the sound isolation, and the workability to ensure a certain freedom in shaping.

DISCLOSURE OF THE INVENTION

The present invention provides a nonflammable wave absorbing material including a conductive filler, an inorganic endothermic filler, and an organic binder as main constituents, wherein all the constituents are integrally layered, and at least one selected from polyvinyl chloride, polyvinylidene chloride, vinyl chloride-vinyl acetate copolymer and ethylene-vinyl chloride copolymer is used as the organic binder.

The integrally layered nonflammable wave absorbing material in accordance with claim 17 holds both the inflammability given by the inorganic endothermic filler and the flexibility given by the organic binder.

A preferable example of the conductive filler is carbon black as disclosed in claim 2. The wave absorbing material foamed as disclosed in claim 3 favorably facilitates the integral stratification. In this case, it is preferable that the wave absorbing material further comprises zinc oxide, zinc carbonate, zinc stearate, tribasic lead sulfate, dibasic lead phosphonate, or lead stearate, that reacts with the organic binder to attain the foaming uniformity and the foaming stability (claim 14).

As disclosed in claim 15, the organic binder preferably has a content of 5 to 25% by weight. It is further preferable that the content of the organic binder is 5 to 15% by weight as disclosed in claim 16.

As disclosed in claim 1, the wave absorbing material of a non-integral layered structure may include: (a) a layer of wave absorbing property including a conductive filler and an organic binder (at least one selected from polyvinyl chloride, polyvinylidene chloride, vinyl chloride-vinyl acetate copolymer and ethylene-vinyl chloride copolymer) as main constituents; and (b) a layer of endothermic property including an inorganic endothermic filler and an organic binder (at least one selected from polyvinyl chloride, polyvinylidene chloride, vinyl chloride-vinyl acetate copolymer and ethylene-vinyl chloride copolymer) as main constituents, wherein the layers (a) and (b) are joined together. Alternatively, as disclosed in claim 17, the wave absorbing material of the non-integral layered structure may have (b) a layer of endothermic property including an inorganic endothermic filler and an organic binder as main constituents, wherein the layer (b) is laid upon one face of a wave absorbing material in accordance with claims 1. In the wave absorbing materials of such structures, the separately prepared layers are joined together to an integral form by means of binding such as adhesion or thermal fusion. This facilitates the manufacture and, in the case where the conductive filler is carbon black, enables the black color of carbon black to be covered with the layer on the endothermic filler side.

In this case the layer (a) of wave absorbing property and/or the layer (b) of endothermic property preferably contain 5 to 25% by weight of the organic binder (claims 1, 15), and more preferably contain 5 to 15% by weight of the organic binder (claims 12, 16).

As disclosed in claims 13 and 3, respectively, the layer (a) of wave absorbing property and/or the layer (b) of endothermic property may be foamed to form the wave absorbing material. Particularly where the layer (b) of endothermic property including the inorganic endothermic filler and the organic binder as the main constituents is foamed, this favorably facilitates the stratification of the endothermic layer. In these cases, the wave absorbing material preferably contains zinc oxide, zinc carbonate, zinc stearate, tribasic lead sulfate, dibasic lead phosphonate, or lead stearate, that reacts with the organic binder to attain the foaming uniformity and the foaming stability (claims 4, 14).

The wave absorbing material in accordance with any one of claims 1–4 and 11–17 may be formed as a whole to a board as disclosed in claim 5 or to a three-dimensional shape as disclosed in claim 6. As disclosed in claim 7, the present invention is also directed to a wave absorber including a wave absorbing material in accordance with any one of claims 2–6 and 11–17. As disclosed in claim 8, the present invention is further directed to a wave anechoic room or a semi-wave anechoic room, in which a wave absorber in accordance with claim 7 is applied for at least part of ceiling, floor, or wall.

The wave absorber may be formed to a pyramidal solid that is suitable for the wave anechoic room or the semi-wave anechoic room.

Any layer included in the wave absorbing material may be formed by foaming and may have a porous network structure for enhanced strength.

The wave absorbing material of the present invention in accordance with any one of claims 1–6 and 11–17 has a variety of applications. In addition to the application for the wave absorber of the wave anechoic room or the semi-wave anechoic room as disclosed in claim 8, the wave absorbing material may be applied for a surface material of a construction, so as to actualize a method of suppressing electromagnetic wave radiation caused by the construction as disclosed in claim 9. The wave absorbing material may also be applied for a wrapping material of an electronic appliance, so as to actualize a method of preventing a leak of electromagnetic wave as disclosed in claim 10.

The present invention is also directed to a method of manufacturing a nonflammable wave absorbing material. The method first mixes calcium carbonate, talc, zinc oxide, a hydroxide, such as aluminum hydroxide or magnesium hydroxide, a foaming agent, and a solvent with a vinyl chloride resin and kneads the mixture. The method adds with stirring, first a conductive filler, such as carbon black, and then a solvent to the kneaded mixture to provide a paste. The method subsequently charges the paste into a mold and applies a pressure and heat to the paste, so as to make the foaming agent foamed and the vinyl chloride resin gelled to react with zinc oxide. The method then cools the mold down and removes a molded object from the mold. The method heats the molded object at ordinary pressure to be foamed and expanded at a predetermined foaming rate. The method finally removes the plasticizer, so as to provide the nonflammable wave absorbing material. This method enables the wave absorbing material to be molded to a desired shape under application of a pressure with a mold. The foamed gas is homogeneously dispersed in the gelled vinyl chloride resin and the inorganic filler. In the meanwhile, the vinyl chloride resin reacts with zinc oxide to enhance the viscosity and the strength of the coat, thereby enabling the formation of a foam with a small quantity of the vinyl chloride resin to facilitate molding of the whole wave absorbing material.

Effects of the Invention

As described above, the wave absorbing material of the present invention has the enhanced nonflammability and improved flexibility to sufficiently avoid possible damages due to the brittleness, while keeping the wave absorbing ability at a comparable level to that of the prior art wave absorbing material. The wave absorber of the present invention formed in a pointed pyramidal shape has sufficient flexibility against the brittleness. The wave absorbing material of the present invention further has favorable workability to attain a certain degree of freedom in shaping and lightness in weight for easy handling, and suitably exerts the thermal insulation, sound isolation, and sound insulation properties. The wave absorbing material of the present invention has a reasonable cost and is favorably applicable for the construction materials having wave absorbing properties and wrapping materials of electronic equipment.

The method of the present invention molds the mixture of the main constituents to manufacture the wave absorbing material having the excellent nonflammability and flexibility. This method is very simple and suitable of mass production and provides the wave absorbing material stably and inexpensively.

BRIEF DESCRIPTION OF THE DRAWINGS

FIG. 1 is a sectional view illustrating a nonflammable wave absorbing material of the present invention;

FIG. 2 is a sectional view illustrating one possible modification;

PREFERRED MODES FOR CARRYING OUT THE INVENTION

Figure 3:
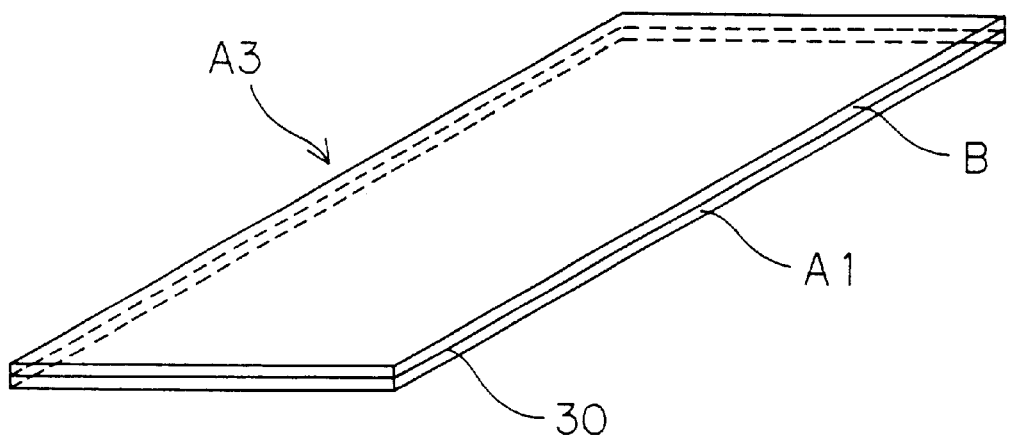
FIG. 3 is a sectional view illustrating another possible modification.

The wave absorbing material of the present invention and the method of manufacturing the same are discussed in detail with preferable examples.

Available examples of the conductive filler include: metal powders and metal fibers, such as copper, nickel, and tin; conductive metal oxide powders, such as tin oxide and antimony oxide; fillers coated with conductive metal oxide, such as silica coated with tin oxide, titania coated with tin oxide, and potassium titanate whiskers coated with tin oxide; and carbons, such as carbon black, carbon graphite, carbon whiskers, and carbon fibers. Carbon black is especially preferable since it enables exertion of stable, uniform, and favorable wave absorbing power. The content of the conductive filler may be set arbitrarily according to the target level of the wave absorbing power. The content of the conductive filler generally ranges from 5 to 80% by weight in both the wave absorbing material described in claim 1 and the wave absorbing layer (a) mainly consisting of the conductive filler and the organic binder.

A metal hydroxide or a water of crystallization-containing inorganic crystal that absorbs heat through removal of water under application of heat is used for the inorganic endothermic filler. Preferable examples include aluminum hydroxide and magnesium hydroxide. The content of the inorganic endothermic filler ranges from 10 to 70% by weight in the wave absorbing material disclosed in claim 1, and from 10 to 90% by weight in the endothermic layer (b) mainly consisting of the inorganic endothermic filler and the organic binder.

The organic binder used here is typically a thermoplastic resin, for example, polyvinyl chloride resin, polyvinylidene chloride resin, vinyl chloride-vinyl acetate copolymer, ethylene-vinyl chloride copolymer, polyethylene resin, and polypropylene resin. Polyvinyl chloride resin, polyvinylidene chloride resin, and ethylene-vinyl chloride copolymer are especially preferable for the organic binder since the use of even a small quantity that does not worsen the nonflammability ensures the sufficient flexibility.

The content of the organic binder ranges from 5 to 25% by weight or more preferably from 5 to 15% by weight in any of the wave absorbing material described in claim 1, the wave absorbing layer (a) mainly consisting of the conductive filler and the organic binder, and the endothermic layer (b) mainly consisting of the inorganic endothermic filler and the organic binder.

In addition to the main constituents discussed above, 5 to 80% by weight of an inorganic filler, such as calcium carbonate, silica, clay, bentonite, talc, mica, wollastonite, glass fibers, and potassium titanate fibers, may be added, in order to adjust the density and the mechanical strength of the wave absorbing material of the present invention and improve the flame resistance. In order to attain the foaming uniformity and the foaming stability, 2 to 70% by weight of zinc oxide, zinc carbonate, zinc stearate, tribasic lead sulfate, dibasic lead phosphonate, and lead stearate may be added. For the purpose of coloring or giving the weather resistance, 0 to 50% by weight of titanium oxide, chrome yellow, red ion oxide, ultramarine, chromium oxide, and cerium oxide may be added.

A foaming agent and a solvent to ensure the fluidity may further be used in the process of manufacturing the wave absorbing material of the present invention, although they decompose or vaporize in the manufacturing process and thereby do not remain as the constituents of the final object.

Examples of the foaming agent include α,α'-azobisisobutyronitrile (hereinafter may be referred to as AIBN), N,N'-dinitrosopentamethylenetetramine (hereinafter may be referred to as DPT), p-toluenesulfonylhydrazide, p,p-oxybis(benzenesulfonylhydrazide), and azodicarbonamide (hereinafter may be referred to as ADCA).

The solvent for ensuring the fluidity may be an aromatic hydrocarbon, such as toluene or xylene.

EXAMPLES

Some examples of the present invention are discussed below.

Example 1

Composition of a layer (a) of wave absorbing property including a conductive filler and an organic binder as main constituents:

| | |
|---|---|
| Calcium carbonate | 24 parts by weight |
| Talc | 24 parts by weight |
| Vinyl chloride resin | 12 parts by weight |
| Zinc oxide | 25 parts by weight |
| Carbon black | 15 parts by weight |
| total | 100 parts by weight |
| AIBN | 7 parts by weight |
| DPT | 10 parts by weight |
| Toluene | 50 parts by weight |

Example 2

Composition including a conductive filler, an inorganic endothermic filler, and an organic binder as main constituents

| | |
|---|---|
| Calcium carbonate | 14 parts by weight |
| Talc | 14 parts by weight |
| Aluminum hydroxide | 20 parts by weight |
| Vinyl chloride resin | 12 parts by weight |
| Zinc oxide | 25 parts by weight |
| Carbon black | 15 parts by weight |
| total | 100 parts by weight |
| AIBN | 8 parts by weight |
| DPT | 5 parts by weight |
| Toluene | 50 parts by weight |

Example 3

Composition including a conductive filler, an inorganic endothermic filler, and an organic binder as main constituents

| | |
|---|---|
| Calcium carbonate | 14 parts by weight |
| Talc | 14 parts by weight |
| Magnesium hydroxide | 20 parts by weight |
| Vinyl chloride resin | 12 parts by weight |
| Zinc oxide | 25 parts by weight |
| Carbon black | 15 parts by weight |
| total | 100 parts by weight |
| AIBN | 8 parts by weight |
| DPT | 10 parts by weight |
| Toluene | 50 parts by weight |

Example 4

Composition of a layer (b) of endothermic property including an inorganic endothermic filler and an organic binder as main constituents

| | |
|---|---|
| Calcium carbonate | 21 parts by weight |
| Talc | 14 parts by weight |
| Aluminum hydroxide | 28 parts by weight |
| Vinyl chloride resin | 12 parts by weight |
| Zinc oxide | 25 parts by weight |
| total | 100 parts by weight |
| AIBN | 8 parts by weight |
| DPT | 5 parts by weight |
| Toluene | 50 parts by weight |

Example 5

Composition including a conductive filler, an inorganic endothermic filler, and an organic binder as main constituents

| | |
|---|---|
| Calcium carbonate | 18 parts by weight |
| Talc | 14 parts by weight |
| Aluminum hydroxide | 20 parts by weight |
| Vinyl chloride resin | 12 parts by weight |

-continued

| | |
|---|---|
| Zinc oxide | 25 parts by weight |
| Carbon black | 11 parts by weight |
| total | 100 parts by weight |
| AIBN | 8 parts by weight |
| DPT | 5 parts by weight |
| Toluene | 50 parts by weight |

Example 6

Composition including a conductive filler, an inorganic endothermic filler, and an organic binder as main constituents

| | |
|---|---|
| Calcium carbonate | 17 parts by weight |
| Talc | 14 parts by weight |
| Aluminum hydroxide | 20 parts by weight |
| Vinyl chloride resin | 12 parts by weight |
| Zinc oxide | 25 parts by weight |
| Carbon black | 12 parts by weight |
| total | 100 parts by weight |
| AIBN | 8 parts by weight |
| DPT | 5 parts by weight |
| Toluene | 50 parts by weight |

In the method of manufacturing the compositions of Examples 1 through 3 shown above, each mixture of a vinyl chloride resin, calcium carbonate, talc, zinc oxide, a hydroxide, such as aluminum hydroxide (magnesium hydroxide), a foaming agent, and a plasticizer of 50 parts by weight of the total weight is kneaded well with a kneader. The method further adds carbon black for giving the wave absorbing power to the mixture with stirring and kneads the whole mixture well with an additional quantity of the plasticizer to provide a paste. The method charges the paste in a mold and applies a pressure in a sealed state. The method subsequently heats the mold to foam the foaming agent and simultaneously gel the vinyl chloride resin. This causes the foamed gas to be homogeneously dispersed in the gelled vinyl chloride resin and the inorganic filler. At this moment, the vinyl chloride resin reacts with zinc oxide to enhance the viscosity and the strength of the coat. This enables foaming with a small quantity of the vinyl chloride resin. The method cools the mold in the sealed state down to room temperature and removes a molded object from the mold. The molded object is heated again at ordinary pressure to be expanded at a target foaming rate. The method finally removes the plasticizer from the molded object and completes a resulting nonflammable wave absorbing material.

The less contents of the inorganic endothermic filler and the vinyl chloride resin result in insufficient foaming and insufficient mechanical strength. The greater contents, on the other hand, make it difficult to ensure the sufficient nonflammability. Zinc oxide functions as a catalyst and stabilizes the foaming action. The endothermic filler of a hydroxide lowers the combustion temperature of the vinyl chloride resin and thereby improves the nonflammability.

This gives a resulting wave absorber having a thickness of 1 to 300 mm.

A nonflammable wave absorbing material A1 shown in FIG. 1 may be formed to a board having a specific thickness suitable for a concrete application or may be formed to a thick board and sliced to a specific thickness suitable for a concrete application.

In accordance with another embodiment shown in FIG. 2, instead of integrally layering all the constituents, a nonflammable wave absorbing material A2 includes a layer 10 having carbon black as a main constituent and a layer 20 having an endothermic filler and an organic binder as main constituents. The layers 10 and 20 are joined together to an integral body by binding means 30, such as adhesion or thermal fusion. The black layer 10 of carbon black can be covered with the layer 20 of the endothermic filler. The covering surface of the endothermic filler improves the appearance of the wave absorbing material. This arrangement conveniently enables the respective layers 10 and 20 to be produced separately and joined later.

In the case of the integral layer structure shown in FIG. 1, a nonflammable sheet B of inorganic substance (Example 4) that is free of carbon black, for example, a foamed sheet of inorganic substance (including a slice from a thick foamed object of inorganic substance), may be bonded to the integral layer by the binding means 30, such as adhesion or thermal fusion. Like the above embodiment, this application also enables the black layer A1 of carbon black to be covered with the nonflammable sheet B of inorganic substance that is free of carbon black.

Figure 4:
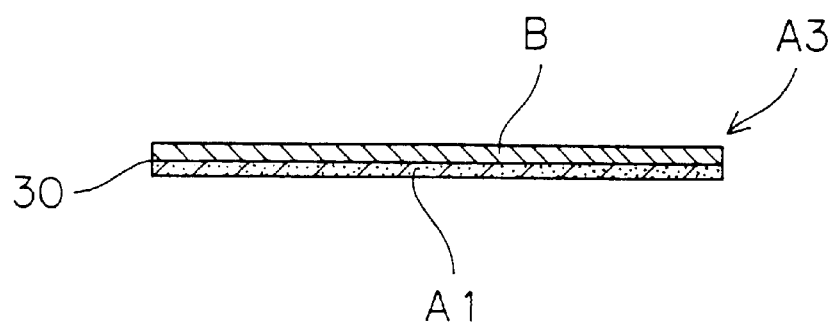
FIG. 4 is a sectional view illustrating a further modification of FIG. 3.
Figure 5:
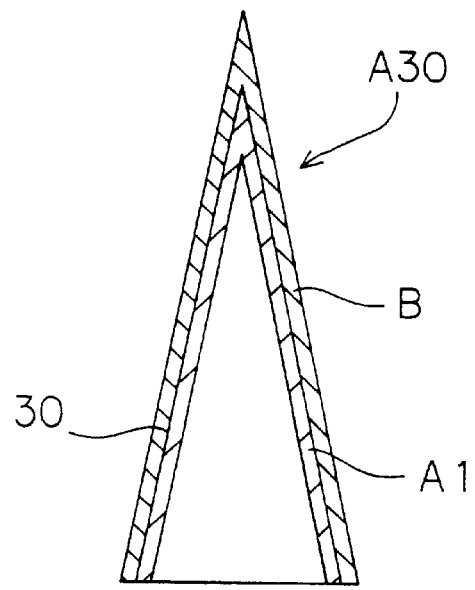
FIG. 5 is a sectional view illustrating an example of a three-dimensional or solid form.
Figure 6:
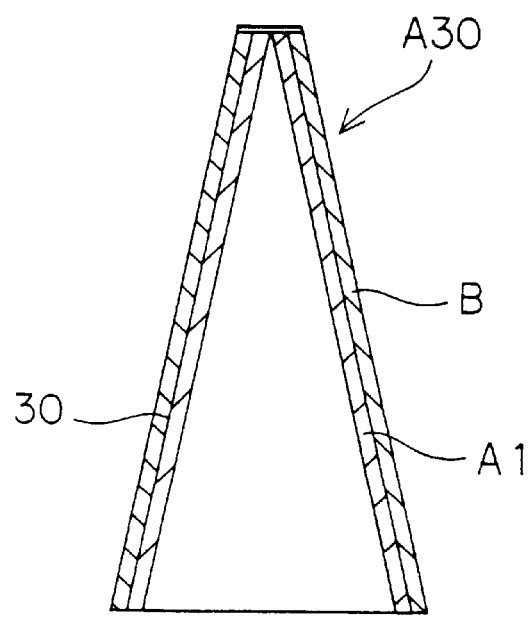
FIG. 6 is a sectional view illustrating a modified example of the solid form.
Figure 7:
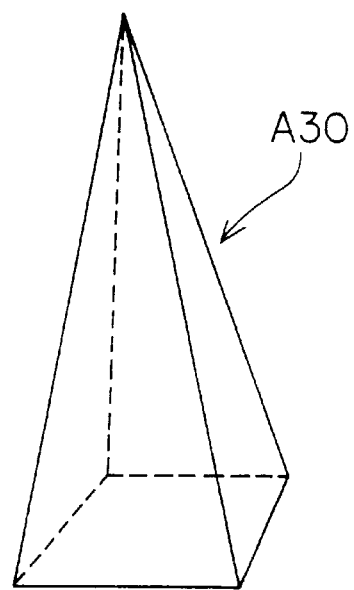
FIG. 7 is a perspective view corresponding to FIG. 5.
Figure 8:
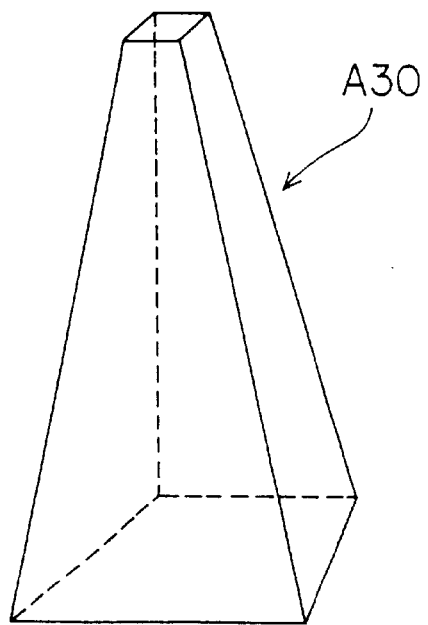
FIG. 8 is a perspective view corresponding to FIG. 6.

A board-like nonflammable wave absorbing material A3 of this structure shown in FIG. 3 (FIG. 4) is suitable for a nonflammable wave absorber for wave anechoic rooms and semi-wave anechoic rooms. FIGS. 5 through 8 show examples of the board-like material A3 formed in pyramidal (wedge-like) solid shapes.

When the nonflammable wave absorbing material A3 of the pyramidal solid shape is used as a wave absorber A30 for wave anechoic rooms and semi-wave anechoic rooms, a single or composite ferrite or metal plate may be used as a base on the bottom of the pyramidal solid shape.

This structure enables the black layer of carbon black not to be exposed to the surface but to be desirably covered. The surface layer B may be colored with an adequate quantity of a pigment. The layer B composed of a foamed sheet ensures the sufficient strength and additionally gives the properties of thermal insulation, flame resistance, sound insulation, and sound isolation. The layer B of the foamed sheet also has favorable workability, for example, in the case of cutting and ensures a sufficient degree of freedom in shaping and excellent binding ability like adhesion.

The structure of FIG. 2 also covers the black layer of carbon black and may thus be used in the solid shapes shown in FIGS. 5 through 8. The dimensions of the pyramidal solid shape are, for example, 600 mm×600 mm as bottom sides and 1.5 m as height.

Figure 9:
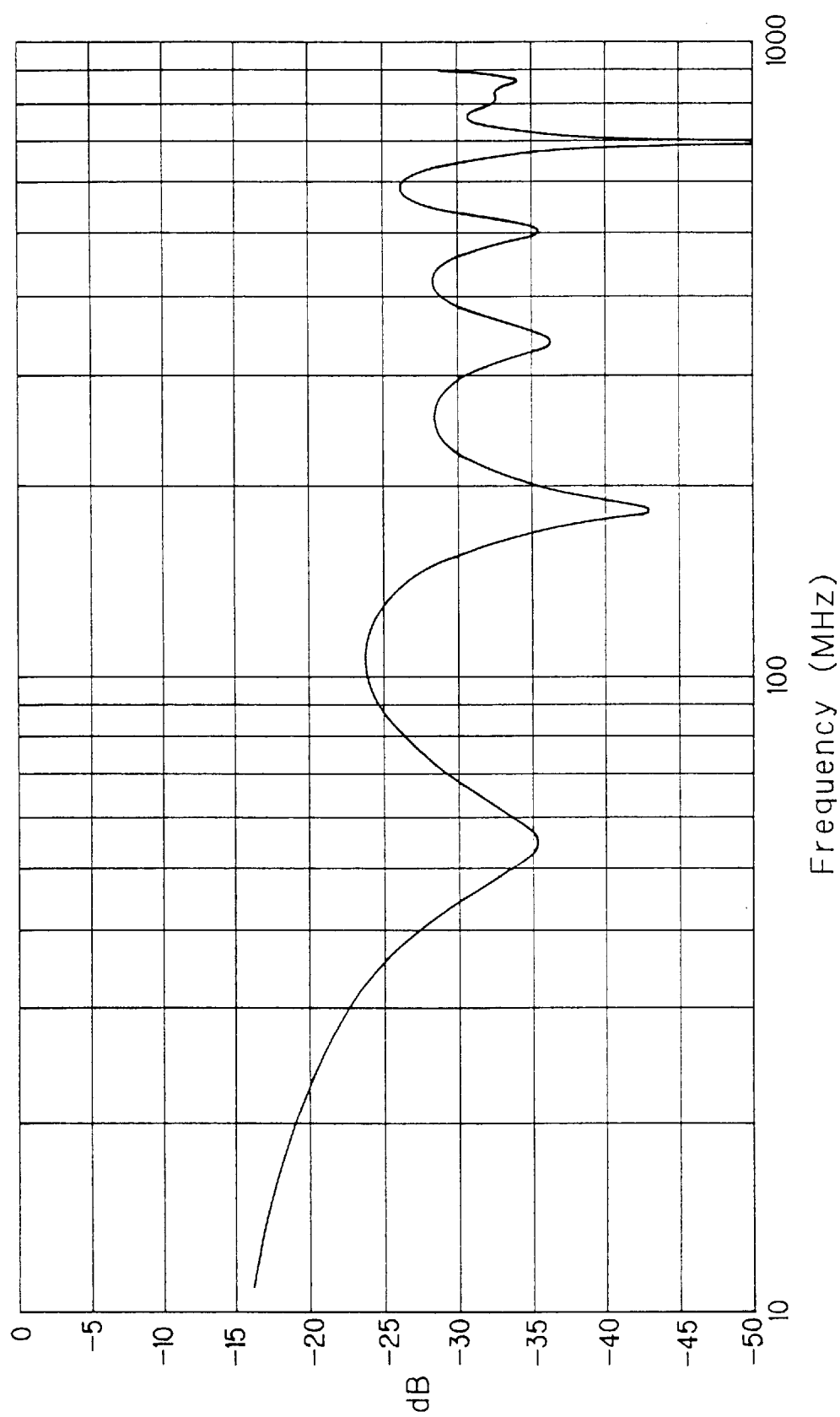
FIG. 9 is a graph showing an observed curve of reflection loss with regard to a wave absorber of the present invention.

FIG. 9 shows the results of a measurement with regard to a wave absorber having the structure shown in FIG. 2 and including the layer 10 of 5 mm in thickness having the composition of Example 1 and the layer 20 of 5 mm in thickness having the composition of Example 4. In the measurement giving the results shown in FIG. 9, the reflection loss (dB) of the nonflammable wave absorber combined with ferrite was measured in a frequency domain of 10 MHz to 1000 MHz with a strip line measurement device, which had an outer conductor having inner dimensions of 600 mm×600 mm and a length of 4 m and a flat center conductor. The results show a favorable reflection loss of not greater than −20 dB in a frequency domain of not lower than 30 MHz.

The nonflammable wave absorbing material of the present invention may be applied for the following nonflammable construction materials having wave absorbing properties:

(1) In the case of the ceiling material,
   it should be interposed between a ceiling base member and a ceiling surface member;
(2) In the case of the wall material,
   it should be interposed between an outer wall member and an interior material, such as a decorative sheet or wall paper;
(3) In the case of the flooring material,
   it should be interposed between an underfloor member and a floor surface material, such as flooring plywood or carpet; and
(4) In the case of the partitioning material,
   it should be interposed between a pair of partitioning members, such as decorative sheets or decorative boards.

In any of the construction materials shown above as (1) through (4), any one of the nonflammable wave absorbing materials A1, A2, and A3 shown in FIGS. 1 through 4 may be used to suppress the electromagnetic wave radiation (malfunction of the equipment and adverse effects on the human body). The construction material may have dimensions of 1800 mm×900 mm and an arbitrary thickness specific for the application. Such construction materials have the advantages of (1) nonflammability (semi-nonflammability, flame resistance), (2) flexibility, (3) lightness in weight (even the specific gravity of or below 0.1), (4) workability, (5) freedom in shaping, (6) thermal insulation, and (7) sound insulation and sound isolation, in addition to the wave absorbing power.

The wave absorbing material of the present invention is also widely applicable as wrapping materials to prevent the electromagnetic wave radiation from electronic equipment and unnecessary reflection of electromagnetic waves.

What is claimed is:

1. A wave absorbing material comprising: (a) a layer of wave absorbing property including a conductive filler and an organic binder as main constituents; and (b) a layer of endothermic property including an inorganic endothermic filler and an organic binder as main constituents, wherein said layers (a) and (b) are joined together and at least one selected from polyvinyl chloride, polyvinylidene chloride, vinyl chloride-vinyl acetate copolymer and ethylene-vinyl chloride copolymer is used as the organic binder.

2. A wave absorbing material in accordance with claim 1, wherein said conductive filler is carbon black.

3. A wave absorbing material in accordance with claim 1, wherein said layer (b) of endothermic property is foamed.

4. A wave absorbing material in accordance with claim 3, wherein said layer (b) of endothermic property contains zinc oxide, zinc carbonate, zinc stearate, tribasic lead sulfate, dibasic lead phosphonate, or lead stearate, that reacts with the organic binder to attain the foaming uniformity and the foaming stability.

5. A wave absorbing material in accordance with claim 1, wherein said wave absorbing material is formed as a whole to a board.

6. A wave absorbing material in accordance with claim 1, wherein said wave absorbing material is formed as a whole to a solid shape.

7. A wave absorber comprising a wave absorbing material in accordance with claim 1.

8. A wave anechoic room or a semi-wave anechoic room, in which a wave absorber in accordance with claim 7 is applied for at least part of ceiling, floor, or wall.

9. A method of suppressing electromagnetic wave radiation caused by a construction by applying a wave absorbing material in accordance with claim 1 for a surface material of said construction.

10. A method of preventing a lead of electromagnetic wave by applying a wave absorbing material in accordance with claim 1 for a wrapping material of an electronic appliance.

11. A wave absorbing material in accordance with claim 1, wherein said layer (a) of wave absorbing property contains 5 to 25% by weight of the organic binder.

12. A wave absorbing material in accordance with claim 1, wherein said layer (a) of wave absorbing property contains 5 to 15% by weight of the organic binder.

13. A wave absorbing material in accordance with claim 1, wherein said layer (a) of wave absorbing property is foamed.

14. A wave absorbing material in accordance with claim 13, wherein said layer (a) of wave absorbing property contains zinc oxide, zinc carbonate, zinc stearate, tribasic lead sulfate, dibasic lead phosphonate, or lead stearate, that reacts with the organic binder to attain the foaming uniformity and the foaming stability.

15. A wave absorbing material in accordance with claim 1, wherein said layer (b) of endothermic property contains 5 to 25% by weight of the organic binder.

16. A wave absorbing material in accordance with claim 1, wherein said layer (b) of endothermic property contains 5 to 15% by weight of the organic binder.

17. A wave absorbing material comprising:
   a first layer including as main constituents a conductive filler, an inorganic endothermic filler, and an organic binder selected from the group consisting of polyvinyl chloride, polyvinylidine chloride, vinyl chloride-vinyl acetate copolymer, ethylene-vinyl chloride copolymer and combinations thereof, wherein all of the constituents are integrally layered; and
   a second layer of endothermic property and including an inorganic endothermic filler and an organic binder as main constituents, said second layer being laid upon one face of said first layer.

* * * * *